(12) United States Patent
Saito et al.

(10) Patent No.: US 7,286,156 B2
(45) Date of Patent: Oct. 23, 2007

(54) LIGHT SOURCE DEVICE FOR SCANNING-EXPOSURE AND METHOD AND APPARATUS FOR SCANNING-EXPOSURE

(76) Inventors: Kenichi Saito, 798, Miyanodai, Kaisei-machi, Ashigarakami-gun, Kanagawa (JP); Yoshinori Morimoto, 798, Miyanodai, Kaisei-machi, Ashigarakami-gun, Kanagawa (JP); Tsuyoshi Tanabe, 798, Miyanadai, Kaisei-machi, Ashigarakami-gun, Kanagawa (JP)

( * ) Notice: Subject to any disclaimer, the term of this patent is extended or adjusted under 35 U.S.C. 154(b) by 210 days.

(21) Appl. No.: 11/229,614

(22) Filed: Sep. 20, 2005

(65) Prior Publication Data

US 2006/0062268 A1    Mar. 23, 2006

(30) Foreign Application Priority Data

Sep. 22, 2004   (JP) .............................. 2004-275783

(51) Int. Cl.
*B41J 27/00* (2006.01)
*G02B 9/00* (2006.01)
*G02B 9/08* (2006.01)

(52) U.S. Cl. ....................... 347/244; 347/258; 359/739

(58) Field of Classification Search ........ 347/241–244, 347/256–258; 359/601–608, 654, 719, 738–740; 250/493.1

See application file for complete search history.

(56) References Cited

U.S. PATENT DOCUMENTS 3,936,149 A * 2/1976 Imai ............................ 359/654

6,977,780 B2 * 12/2005 Matsumoto et al. ........ 359/719
2004/0238761 A1 * 12/2004 Saito et al. .............. 250/493.1

FOREIGN PATENT DOCUMENTS

| JP | 2000-066128 A | 3/2000 |
|----|---------------|--------|
| JP | 2001-024230 A | 1/2001 |
| JP | 2003-255253 A | 9/2003 |

\* cited by examiner

*Primary Examiner*—Hai Pham
(74) *Attorney, Agent, or Firm*—Birch, Stewart, Kolasch & Birch, LLP

(57) ABSTRACT

A blue laser light source is a semiconductor laser having a sapphire substrate that is transparent to a wavelength of a blue laser beam emitted from an active layer. A condenser lens converges the blue laser beam at a focal point where a modulator is placed. A slit plate limits the light flux on the exit side of the condenser lens. A slit of the slit plate is located at a depth position (Z) on an optical axis of the condenser lens, and the depth position satisfies the following conditions: $Z \geq Z0$ ($Z0<0$) and $Pp(Z0)=P1$, wherein Z is assumed to have a positive value on a forward side of the blue laser beam from the focal point, $Pp(Z)$ is a value obtained by dividing a width of the blue laser beam in the parallel direction to the active surface at the depth position Z by a width of the extraneous light in the parallel direction at said depth position, and P1 is a convergent value of $Pp(Z)$ at the infinity ($Z \to \infty$).

7 Claims, 10 Drawing Sheets

LIGHT SOURCE DEVICE FOR SCANNING-EXPOSURE AND METHOD AND APPARATUS FOR SCANNING-EXPOSURE

FIELD OF THE INVENTION

The present invention relates to a light source device for scanning-exposure and a method and an apparatus for scanning-exposure, and especially to a light source device for scanning-exposure that is provided with a flare stop for limiting light bundle to eliminate extraneous light elements called flares which are specific to any GaN semiconductor lasers.

BACKGROUND ARTS

As a photographic printer that records images based on image data, a laser printer using laser beams is known, wherein the laser beams is scanned across a sheet of photosensitive material in a main scan direction as the photosensitive material is conveyed in a sub scan direction orthogonal to the main scan direction. An example of the photosensitive material is of a silver-salt type, on which a latent image is recorded by the scanning-exposure, and comes up to the surface by photographic development.

The laser printer is provided with a scanning-exposure apparatus that uses a light source device for generating laser beams of three primary colors: red, green and blue. The laser beams are modulated in accordance with corresponding color image data. The modulated laser beam of each color is refracted in the main scan direction by use of a polygonal mirror, to scan and expose the photosensitive material while it is being conveyed.

In such a scanning-exposure apparatus, light sources for the red light beam and the blue light beam are generally semiconductor lasers or laser diodes, whereas a light source for the green light beam is a second harmonic generation (SHG) laser that is a combination of a diode-pumped solid-state laser and an SHG element.

The semiconductor laser for red is generally configured by forming a light emitter on a substrate made of GaAs, and the light emitter has a double-hetero structure where an active layer is sandwiched between a light guide layer and a cladding layer. The light emitter uses AlGaIP, AlGaAs and InGaAsP as its materials. The GaAs substrate absorbs light components of its oscillation wavelength. Since the opposite electrode uses a light absorbing material like InGaAs, the light emitted from the red semiconductor laser is confined to an emission range of several micrometer wide. Therefore, the red semiconductor laser does not specifically suffer from stray light beams that are caused by other semiconductor materials than the light emitter.

On the other hand, the semiconductor laser for blue generally uses materials of GaN group. Since a single crystal of GaN has not yet been put into practice, the blue semiconductor laser uses a substrate made of such a substitute material that is transparent to light components of the oscillation wavelength, as sapphire ($Al_2O_3$) and SiC.

As shown in FIG. 11, an GaN group semiconductor laser is mainly constituted of a sapphire substrate 42, a buffer layer 41 formed from n-GaN on the sapphire substrate 42, a light emitter 40 formed on the buffer layer 41 and has a double-hetero structure, a positive electrode 50 connected to a top of the light emitter 40, and a negative electrode 51 connected to the buffer layer 41. Applying a voltage across the positive and negative electrodes 50 and 51 to raise current injected into the light emitter 40 causes the laser emission to project the blue laser beams from an active layer 45 of the light emitter 40 in a direction substantially perpendicular to the drawing surface of FIG. 11.

At that time, the blue laser beams from the light emitter 40 are partially diffused as stray lights inside the sapphire substrate 42. Some of the stray lights come back to the light emitter 40, and some leak outsides. The stray light leaked in the projecting direction of the sapphire 42 is called flare, and is transmitted along with the true blue laser beams that are projected directly from the active layer of the light emitter 40. So the flare badly affects on the shape of beam spots focused on the photosensitive material, damaging the quality of the recorded image.

In order to eliminate the flare, a light source device disclosed in Japanese Laid-open Patent Application No. 2001-24230 suggests placing a slit plate or a pinhole near a focal position of a condenser lens. A scanning-exposure apparatus disclosed in Japanese Laid-open Patent Application No. 2003-255253 suggests eliminating the flare by limiting numerical aperture of an aperture that is provided at an entrance of a collimator lens. Japanese Laid-open Patent Application No. 2000-66128 suggests a scanning-exposure apparatus that eliminates the flare by providing a pinhole between a light source and a collimator lens.

Although above three prior arts can eliminate the flare to some extent by limiting the light flux of the laser, these prior arts cannot efficiently eliminate the flare from the laser because the study for defining an optimum position of the slit plate or the pinhole has not sufficiently been done in this field.

SUMMARY OF THE INVENTION

In view of the foregoing, a primary object of the present invention is to provide a light source device for scanning-exposure that can effectively eliminate the flare radiated from a semiconductor laser whose substrate is transparent to its lasing wavelength, and a scanning-exposure apparatus using the light source device.

Another object of the present invention is to provide a scanning-exposure method that can eliminate the flare effectively.

To achieve the above and other objects, a light source device for scanning-exposure of the present invention comprises a semiconductor laser having a substrate that is transparent to a wavelength of a laser beam emitted from an active layer, a condenser lens for converging the laser beam at least in a direction parallel to an active surface of the active layer, and a light flux limiting device for limiting light flux on an exit side of the condenser lens so as to eliminate extraneous light that is radiated from the substrate, wherein the light flux limiting device is located at a depth position Z on an optical axis of the condenser lens, the depth position Z satisfying conditions defined as follows:

$Z \geq Z0$, $Z0 < 0$ and $$Pp(Z0) = \lim_{Z \to \infty} \{Pp(Z)\}$$

wherein Z is assumed to have a positive value on a forward side of the laser beam from a focal point of the laser beam through the condenser lens, Pp(Z) is a value obtained by dividing a width of the laser beam in the parallel direction to the active surface at the depth position Z by a width of the extraneous light in the parallel direction at the depth position Z.

According to a preferred embodiment, the light flux limiting device has an opening whose width Δ in the parallel direction to the active surface is defined by a relational expression as follows:

$$\Delta \leq (E\text{max} - E\text{min})/[E\text{min} \cdot (R-1) \cdot \{dp(Z) + dv(Z)\}]$$

wherein Emax is a maximum light volume of the semiconductor laser, Emin represents a light volume at a lasing threshold, R is a light volume rate representative of a ratio between a maximum exposure amount and a minimum exposure amount necessary for gaining sufficient density contrast, dp(Z) represents a width of the extraneous light in the parallel direction at the depth position Z, and dv(Z) represents a width of the extraneous light in a vertical direction to the active surface at the depth position Z.

A scanning-exposure apparatus for scanning a photosensitive material with at least a laser beam to record an image on the photosensitive material is comprised of the light source device of the present invention, a deflector placed on an exit side of the light source device, for deflecting the laser beam, and a lens system for projecting the deflected laser beam onto the photosensitive material.

According to the present invention, a scanning-exposure method for scanning a photosensitive material with at least a laser beam emitted from a light source device using a semiconductor laser whose substrate is transparent to a wavelength of a laser beam emitted from an active layer, a condenser lens for converging the laser beam at least in a direction parallel to an active surface of the active layer, and a light flux limiting device for limiting light flux on an exit side of the condenser lens so as to eliminate extraneous light that is radiated from the substrate, comprises steps of: locating the light flux limiting device at a depth position Z on an optical axis of the condenser lens, the depth position Z satisfying conditions defined as follows:

$$Z \geq Z0, Z0 < 0 \text{ and}$$

$$Pp(Z0) = \lim_{Z \to \infty} \{Pp(Z)\}$$

wherein Pp(Z) is a value obtained by dividing a width of the laser beam in the parallel direction to the active surface at the depth position Z by a width of the extraneous light in the parallel direction at the depth position; and forming an opening of the light flux limiting device to have a width Δ in the parallel direction to the active surface, that is defined by a relational expression as follows:

$$\Delta \leq (E\text{max} - E\text{min})/[E\text{min} \cdot (R-1) \cdot \{dp(Z) + dv(Z)\}]$$

wherein Emax represents a maximum light volume of the semiconductor laser, Emin represents a minimum light volume at a lasing threshold, R is a light volume rate representative of a ratio between a maximum exposure amount and a minimum exposure amount necessary for gaining sufficient density contrast, dp(Z) represents a width of the extraneous light in the parallel direction at the depth position Z, and dv(Z) represents a width of the extraneous light in a vertical direction to the active surface at the depth position Z.

In a case where the photosensitive material is a silver salt photosensitive material, a logarithmic value log (R) of the light volume rate R is defined to satisfy a condition: log(R) ≧1.5.

The depth position defined as above is a position where the extraneous light can be eliminated from the laser beam at a high efficiency. Therefore, locating the light flux limiting device at that position enables eliminating the extraneous light efficiently while maintaining the quality of the laser beam and without reducing the light volume of the laser beam.

Defining the width of the opening in the parallel direction to the active surface of the semiconductor laser to satisfy the above described conditions ensures the necessary light volume rate or light volume range only in the laser emission area, while maintaining the quality of the laser beam and without reducing the light volume of the laser beam.

BRIEF DESCRIPTION OF THE DRAWINGS

The above and other objects and advantages will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

Figure 1:
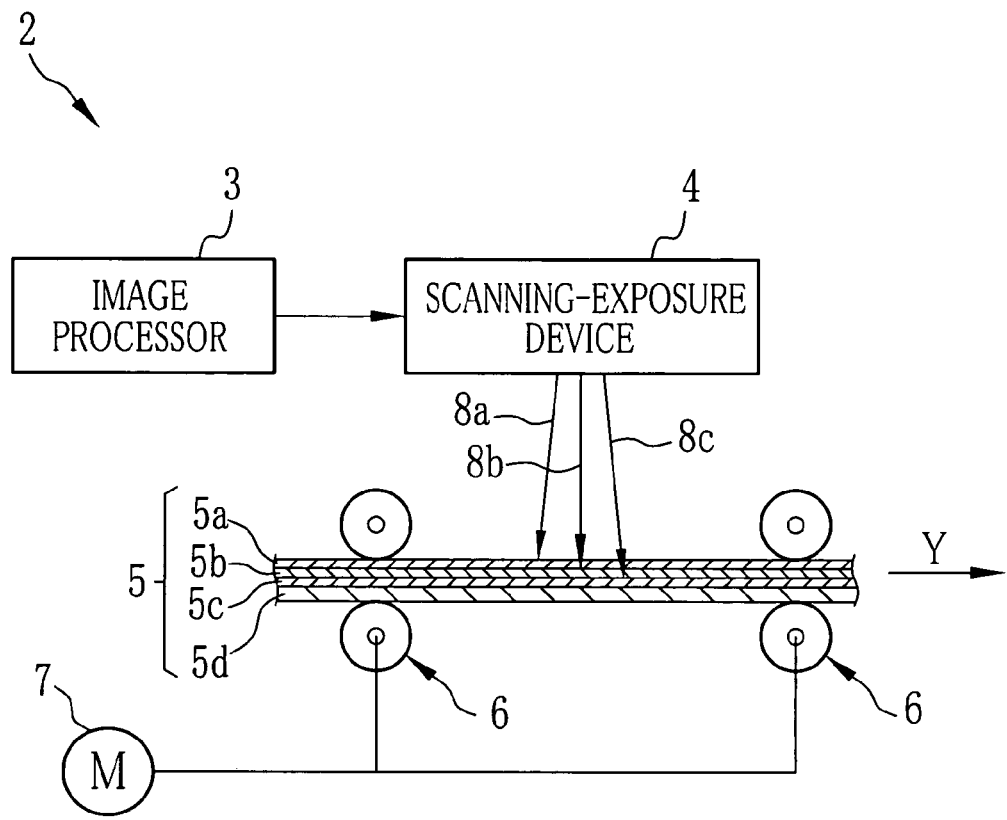
FIG. 1 is a schematic diagram illustrating a laser printer.

FIG. 1 shows a laser printer 2 that is constituted of an image processor 3, a scanning-exposure device 4, conveyer rollers 6 for conveying a sheet of photosensitive material 5, and a motor 7 for driving the conveyer rollers 6. The image processor 3 is fed with image data obtained by reading images from photographic film through a CCD scanner or capturing images by a digital camera. The image processor 3 processes the image data for image correction and the like to output them as image recording data.

Figure 2:
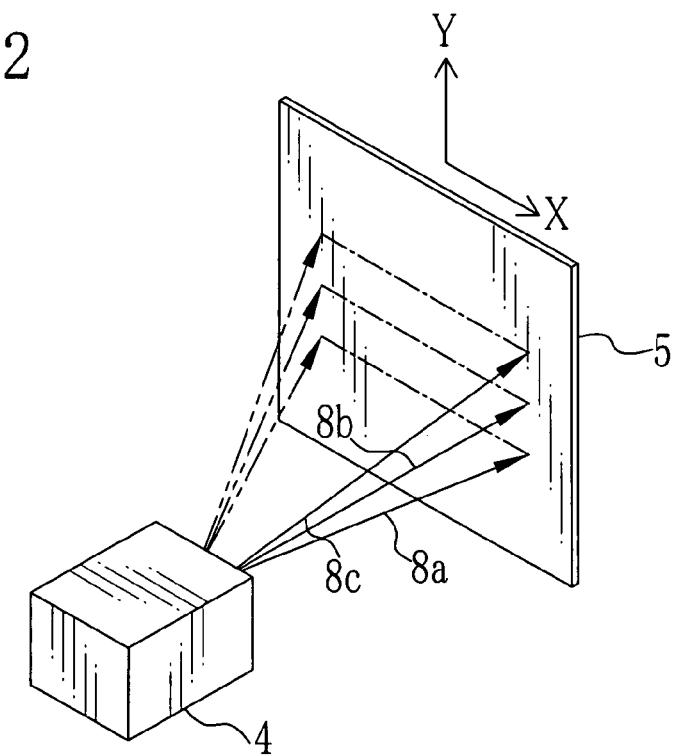
FIG. 2 is an explanatory perspective view illustrating a main scan direction and a sub scan direction of laser beams.

The scanning-exposure device 4 is provided with three laser light sources that emit laser beams 8a to 8c for red, green and blue. The scanning-exposure device 4 modulates the laser beams 8a to 8c in accordance with the image recording data from the image processor 3. The modulated laser beams 8a to 8c are projected to the photosensitive material 5 while being scanned in a main scan direction X, as shown in FIG. 2. The photosensitive material 5 is a sheet having red, green and blue photosensitive layers 5a, 5b and 5c formed atop another on a supporting material 5d, which are sensitive to the red, green and blue laser beams 8a, 8b and 8c respectively.

The conveyer rollers 6 is driven by the motor 7 to convey the photosensitive material 5 at a constant speed in a sub scan direction Y orthogonal to the main scan direction X. Accordingly, the laser beams 8a to 8c scan the photosensitive material 5 in the main scan direction as the photosensitive material 5 is conveyed in the sub scan direction, so the photosensitive material 5 is exposed line by line, to record a latent image in the photosensitive layers 5a to 5c. The latent image becomes visible through the development.

Figure 3:
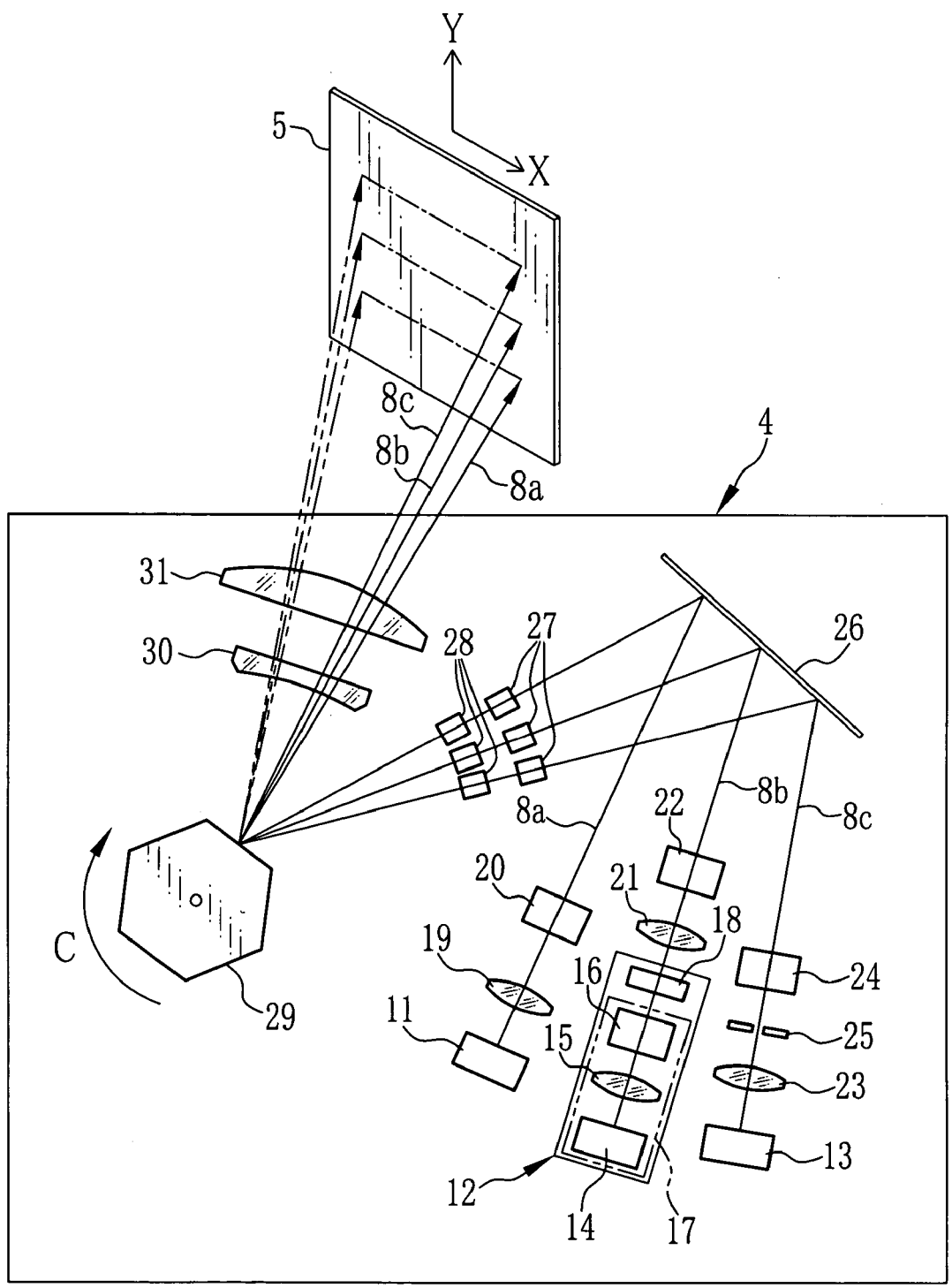
FIG. 3 is a schematic diagram illustrating an interior of a scanning-exposure device of the laser printer.

FIG. 3 shows the interior of the scanning-exposure device 4. The red laser light source 11, the green laser light source 12 and the blue laser light source 13 emit laser of different wavelengths. For example, The red laser light source 11 is a semiconductor laser that emits the red laser beam 8a of 680 nm in wavelength, and the blue laser light source 13 is a semiconductor laser that emits the blue laser beam 8c of 400 nm in wavelengths.

On the other hand, the green laser light source 12 is a SHG laser that is a combination of a laser-pumped solid-state laser 17 and a second harmonic generation (SHG) element 18, wherein the laser-pumped solid-state laser 17 consists of a semiconductor laser 14, a condenser lens 15 placed at the exit of the semiconductor laser 14, and a laser crystal or laser active medium 16. The laser-pumped solid-state laser 17 is exited by a laser beam from the semiconductor laser 14, to emit a laser beam that is 1064 nm in wavelength in this example. The SHG element 18 converts the laser beam from the laser-pumped solid-state laser 17 into a laser beam of a half wavelength of 532 nm that is emitted as the green laser beam 8b.

At the exit of the red laser light source 11, a condenser lens 19 and an acoustooptical modulator (AOM) 20 are sequentially placed. The red laser beam 8a from the red laser light source 11 enters the AOM 20 through the condenser lens 19, and is diffracted by acoustooptical effect in the AOM 20, so that the AOM 20 modulates the intensity of the red laser beam 8a and outputs only primary diffracted red laser beam.

At the exit of the green laser light source 12, a condenser lens 21 and an AOM 22 are sequentially placed. In the same way as for the red laser beam 8a, the green laser beam 8b from the green laser light source 12 enters the AOM 21 through the condenser lens 21, and is diffracted by acoustooptical effect in the AOM 22, so that the AOM 22 modulates the intensity of the green laser beam 8b and outputs only primary diffracted green laser beam.

At the exit of the blue laser light source 13, a condenser lens 23, an AOM 24 and a slit plate 25 as a light flux limiting device are placed. The slit plate 25 is placed between the condenser lens 23 and the AOM 24, at a position that satisfies several conditions as set forth later. The blue laser beam 8c from the blue laser light source 13 travels through the condenser lens 23 and the slit plate 25, so that the slit plate 25 eliminates the flare or excessive light that is specific to the blue laser light source 13 and included in the blue laser beam 8c. After traveling through the slit plate 25, the blue laser beam 8c enters the AOM 24 and is diffracted by acoustooptical effect in the AOM 20. Thus, the AOM 20 modulates the intensity of the blue laser beam 8c and outputs only primary diffracted blue laser beam.

A flat mirror 26 is placed on the exit side of the AOMs 20, 22 and 24. The laser beams 8a to 8c output as the primary diffracted beams from the AOMs 20, 22 and 24 are reflected by the flat mirror 26. On the exit side of the flat mirror 26 are placed a collimator lens 27, a cylindrical lens 28 and a polygonal mirror or deflector 29 sequentially from the flat mirror 26.

The laser beams 8a to 8c as reflected from the flat mirror 26 are projected through the collimator lens 27 and the cylindrical lens 28 onto an approximately same position on each reflection surface of the polygonal mirror 29. The polygonal mirror 29 turns in a direction indicated by an arrow C that is clockwise direction in FIG. 3, at an approximately constant angular speed, reflecting the laser beams 8a to 8c to deflect the beams so as to scan an exposure surface of the photosensitive material 5 with them in the main scan direction X. On the exit side of the polygonal mirror 29 are placed an f-theta lens 30 for correcting scanning speed of the beams on the exposure surface of the photosensitive material 5, and a cylindrical lens 31 for optical face tangle error correction. The cylindrical lens 31 has a lens power in the sub scan direction Y, which is perpendicular to the drawing surface of FIG. 3.

The exposure surface of the photosensitive material 5 is placed in an optically conjugate position to the positions of the AOMs 20, 22 and 24 that are diffraction points. Accordingly, the laser beams 8a to 8c output from the AOMs 20, 22 and 24 have the same shape and are projected onto the exposure surface of the photosensitive material 5, without being changed.

Figure 4:
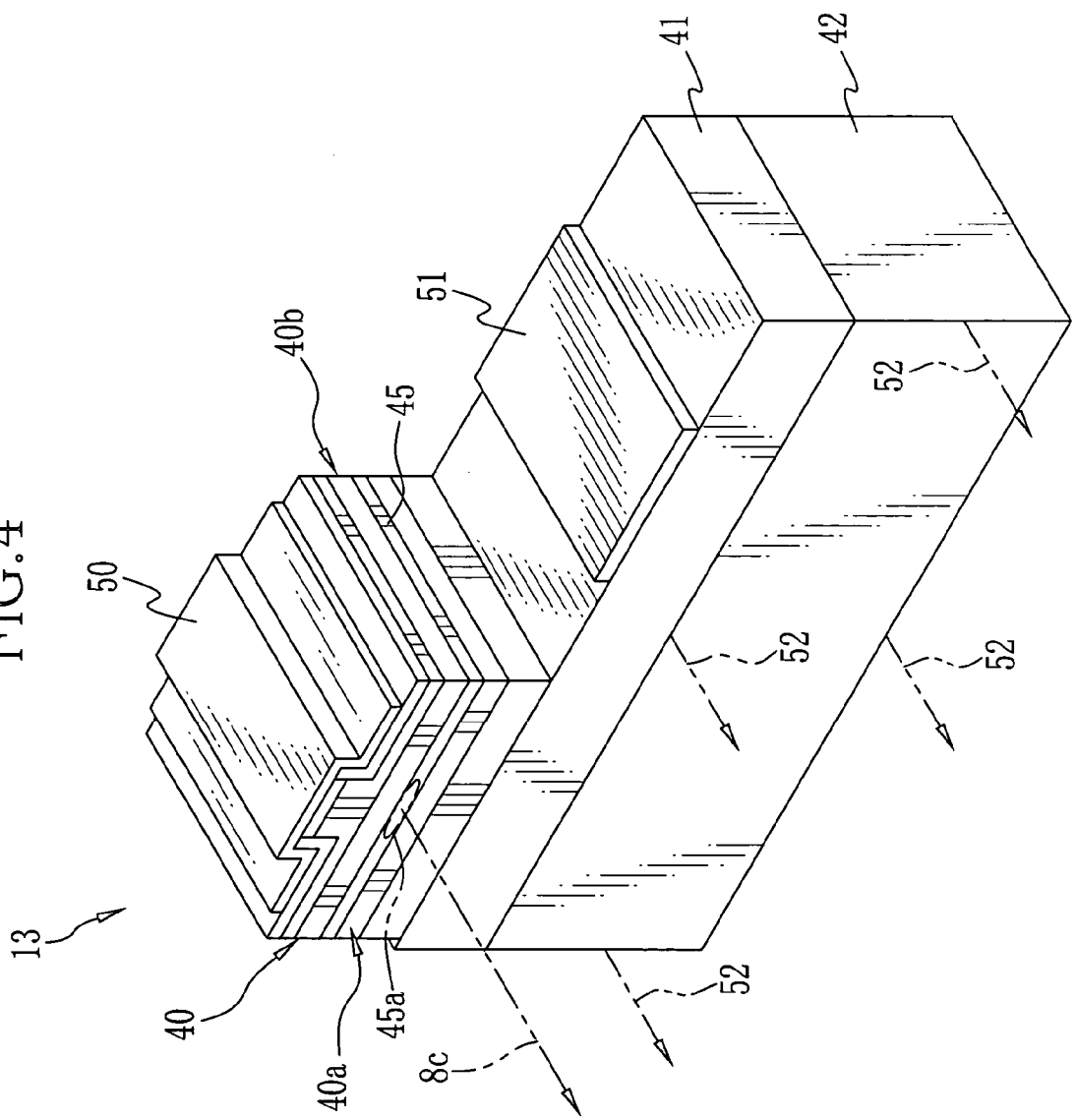
FIG. 4 is a perspective view of a blue laser light source of the scanning-exposure device.
Figure 11:
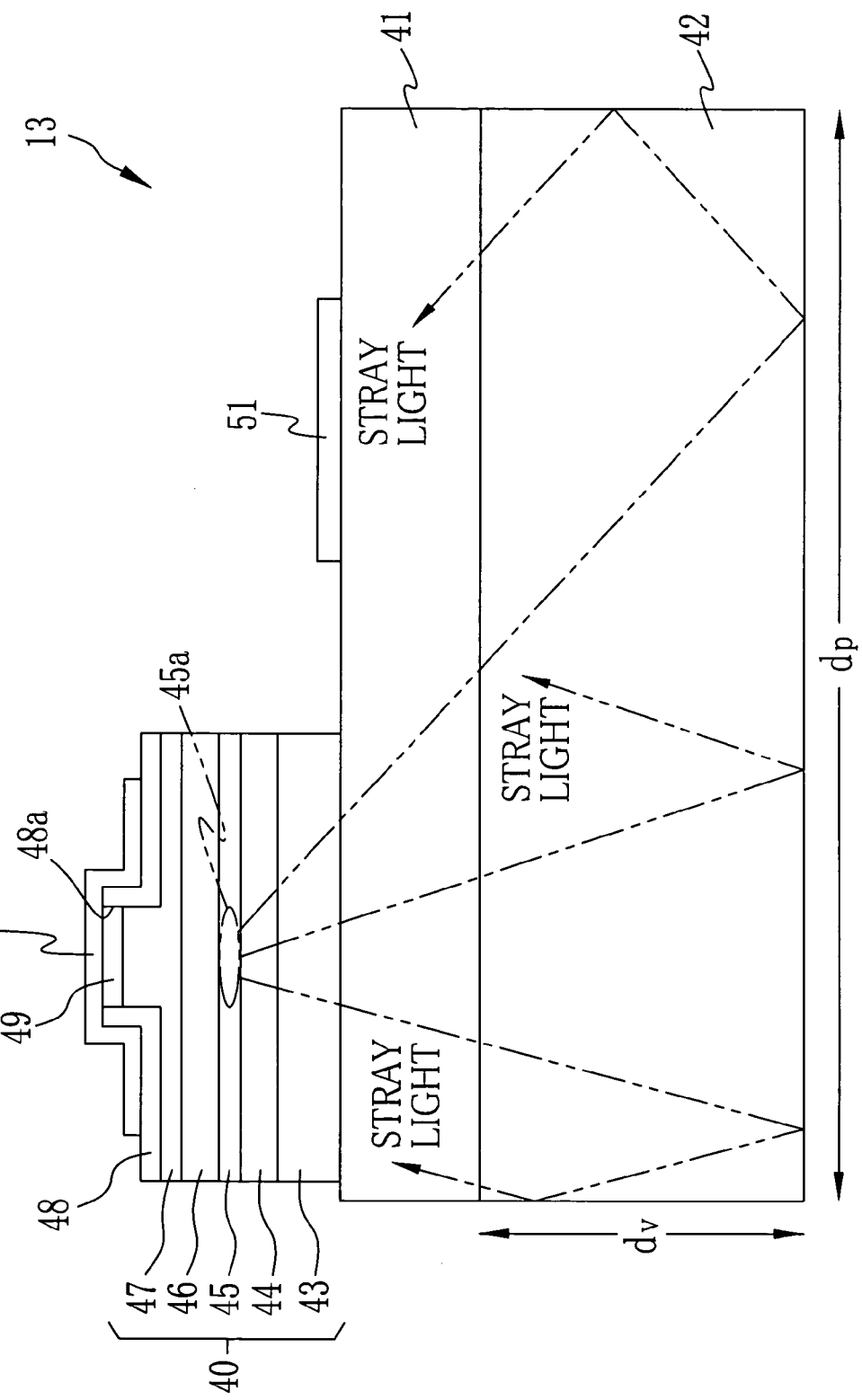
FIG. 11 is an explanatory diagram illustrating stray light generated inside the blue laser light source.

As shown in FIGS. 4 and 11, the blue laser light source 13 is an GaN group semiconductor laser, wherein a light emitter 40 having a double-hetero structure made of GaAlN, GaAlN and GaN is formed on a sapphire substrate 42, particularly a sapphire c-surface substrate, through an n-GaN buffer layer 41.

The light emitter 40 consists of an n-AlGaN cladding layer 43, an n-GaN light guide layer 44, an undoped active layer 45, a p-GaN light guide layer 46 and a p-AlGaN cladding layer 47, which are formed atop another in this order from the bottom. On top of the p-AlGaN cladding layer 47 is formed an SiN coating layer 48 with a stripe window 48a for current injection. A p-GaN capping layer 49 is formed on the p-AlGaN cladding layer 47 so as to close the stripe window 48a. A positive electrode 50 is formed on the p-GaN capping layer 49 so as to cover up the stripe window 48a. On the other hand, a negative electrode 51 is formed on the n-GaN buffer layer 41.

The active layer 45 has a multiquantum well structure, e.g. a triple quantum well structure, wherein InGaN well layers and InGaN barrier layers are alternately formed atop another, so that the active layer 45 emits light of a wavelength corresponding to band gap energy. The light guide layers 44 and 46 shut up those light components which are generated in the undoped active layer 45. The cladding layers 43 and 47 are provided for raising electron density and hole density in a p-n junction of the active layer 45.

Applying a positive voltage and a negative voltage respectively to the positive and negative electrodes 50 and 51 and injecting current into the stripe window 48a let electrons and holes flow into the active layer 45 from the negative side and the positive side respectively, thereby to form an inverted population. The electrons and the holes are coupled in the active layer 45 to emit light. The light is shut up in the active layer 45 by the light guide layers 44 and 46, so the light is reflected repeatedly by mirror surfaces 40a and 40b which are formed on opposite ends of the light emitter 40. When the injected current goes over a threshold value, laser emission starts to emit the blue laser beam 8c from one mirror surface 40a. It is to be noted that the current flows only through a light emission area 45a of the active layer 45, and the emission of the blue laser beam 8c occurs merely in the light emission area 45a.

The sapphire substrate 42 is transparent to the wavelength of the blue laser beam 8c, i.e. 400 nm, so some fraction of the blue laser beam 8c as emitted from the light emitter 40 is diffused as so-called stray light inside the sapphire substrate 42, as shown in FIG. 11. The stray light comes back to the light emitter 40 or leaks out.

As shown in FIG. 4, the stray light leaking out of the periphery of the sapphire substrate 42 is called the flare 52. The flare 52 has a rectangular pattern so that it looks like the sapphire substrate 42 emit light from its periphery. The flare 52 is transmitted together with the blue laser beam 8c in the laser emitting direction. The surface of the sapphire substrate 42, which is flat to the mirror surface 40a, is rectangular and has a length dp of 0.3 mm to 0.4 mm in a direction that is parallel to an active surface or the p-n junction of the active layer 45, and a length dv of 0.1 mm to 0.2 mm in a direction vertical to the active surface of the active layer 45. Hereinafter the direction that is parallel to the active surface will be called simply the lateral direction, wherein the direction that is vertical to the active surface will be called simply the vertical direction.

Figure 5:
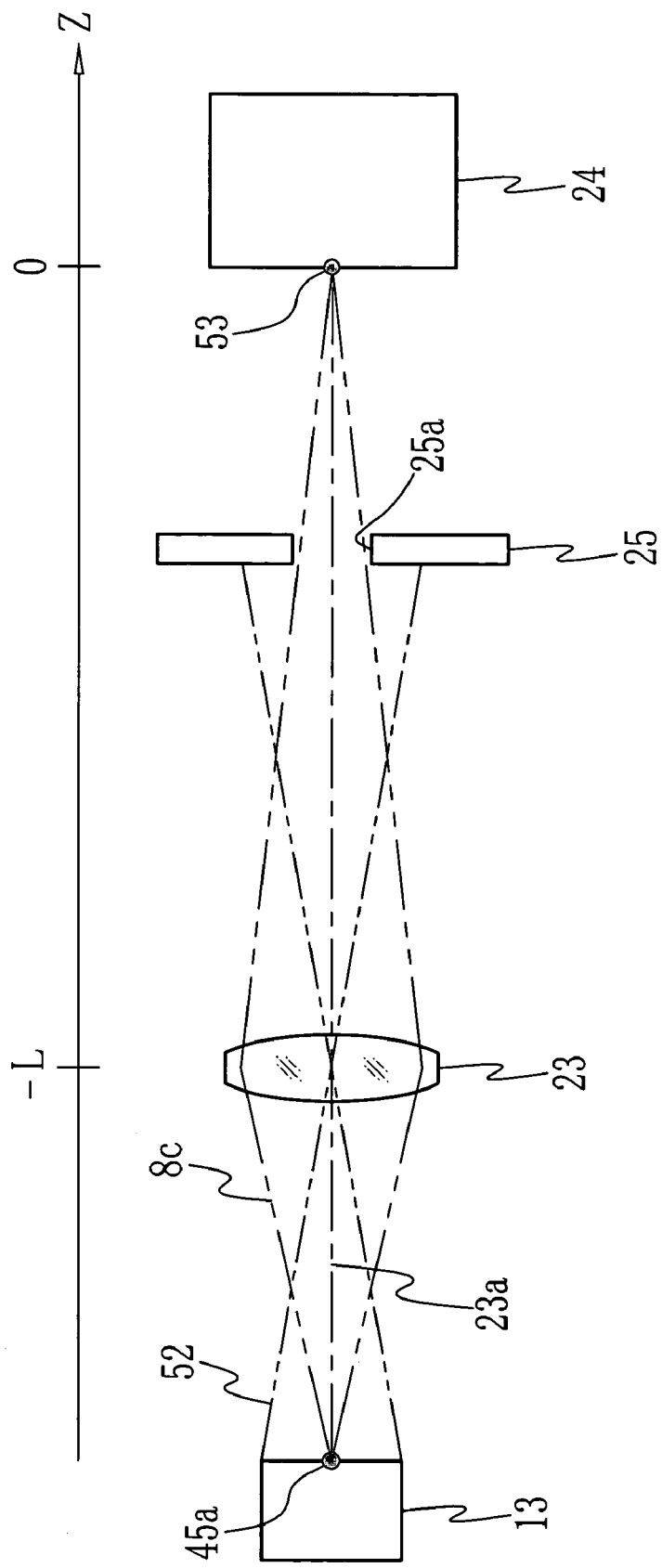
FIG. 5 is a top plan view illustrating a slit plate arranged on an optical axis of the blue laser light source.

As shown in FIG. 5, the blue laser light source 13 is placed such that an optical axis 23a of the condenser lens 23 crosses the mirror surface 40a, i.e. the emission surface of the light emitter 40, substantially perpendicularly, and that the optical axis 23a travels through the laser emission area 45a of the active layer 45. The AOM 24 is placed in a light convergent plane or focal plane that includes a focal point 53 of the blue laser beam 8c through the condenser lens 23, and is perpendicular to the optical axis 23a. The slit plate 25 is placed such that the optical axis 23a goes through its opening or slit 25a.

Figure 6A:
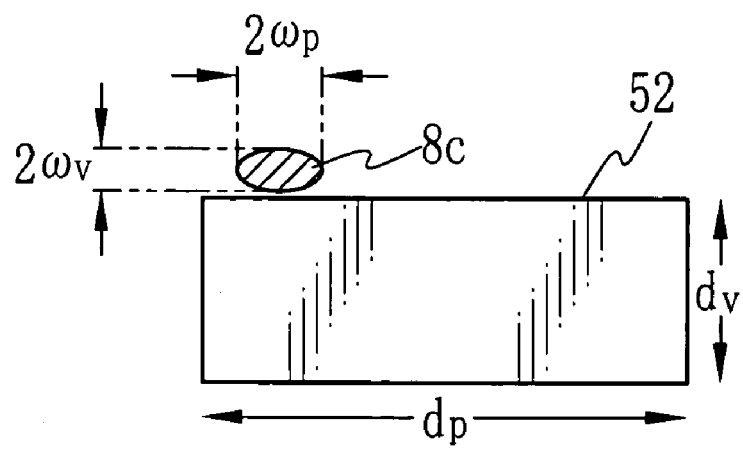
FIG. 6 shows explanatory views illustrating images of a blue laser beam and its flare formed on a light emitting surface and a focal plane.

FIG. 6A shows images of the blue laser beam 8c and the flare 52 on the emission surface of the light emitter 40. The intensity of the blue laser beam 8c substantially shows Gaussian distribution with respect to any perpendicular direction to the optical axis 23a. In order to define the beam shape at the emission point of the blue laser beam 8c, those positions where the intensity of the blue laser beam 8c becomes $1/e^2$, that is about 13.5% relative to its peak, define a beam periphery, wherein e is a base of natural logarithm. Besides, ωp and ωv represent beam radii in the above-mentioned lateral and vertical directions of the blue laser light source 13 respectively. On the emission surface, the image of the flare 52 appears as a rectangle having the above mentioned lengths of dp and dv in the lateral and vertical directions respectively.

Figure 6B:
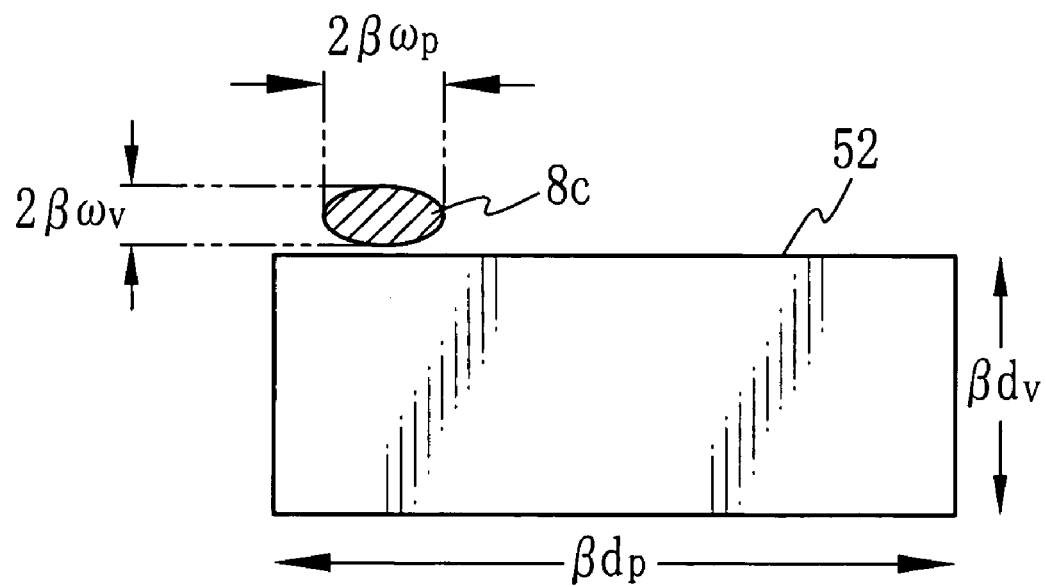
Figure 7:
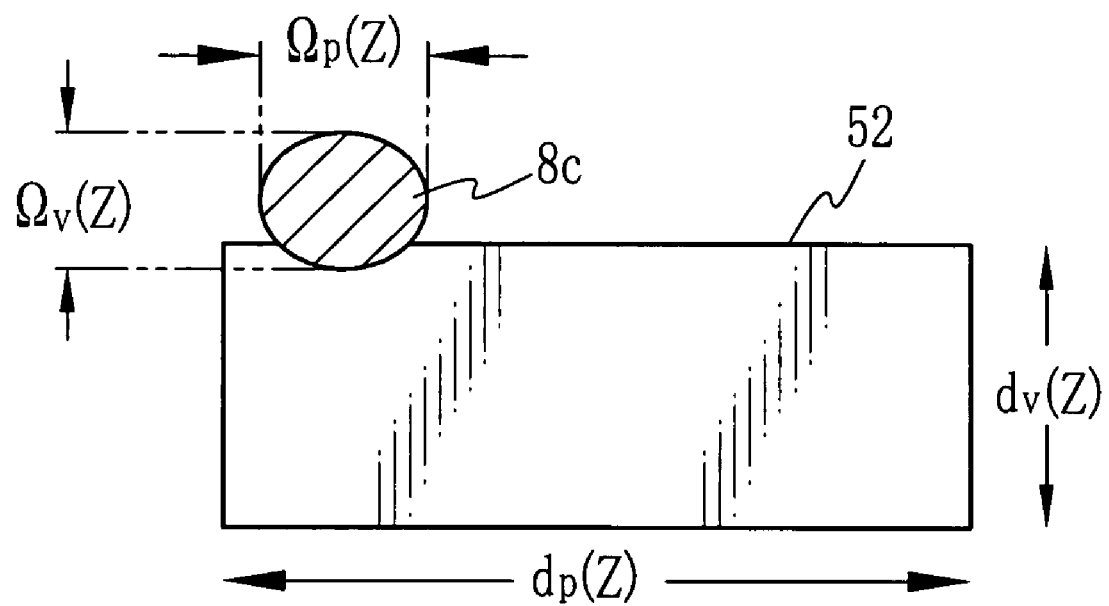
FIG. 7 is an explanatory view illustrating images of the blue laser beam and its flare formed at a depth position on the optical axis.

FIG. 6B shows images of the blue laser beam 8c and the flare 52, which are formed on the focal plane when the slit plate 25 is not placed. Providing that β represents a lateral magnification of the condenser lens 23, the images of the blue laser beam 8c and the flare 52 on the focal plane coincide with ones obtained by magnifying the corresponding images on the emission surface at the magnification β in the vertical and lateral directions.

The slit plate 25 is placed between the condenser lens 23 and the AOM 24, at a position where the flare 52 is effectively shielded out. As mentioned above, the images of the blue laser beam 8c and the flare 52 on the focal plane coincide with ones obtained by magnifying the images on the emission surface at the magnification β, but images of the blue laser beam 8c and the flare 52 are differently magnified in other depth positions on the optical axis 23a. In such a depth position where the image of the blue laser beam 8c is larger, while the image of the flare is smaller, the effect of eliminating the flare 52 through the slit 25 is lessened. In other words, the flare 52 can be eliminated through the slit 25 most effectively at a depth position where the image of the blue laser beam 8c becomes the smallest relative to the size of the image of the flare 52. According to the present embodiment, as set forth later, the position of the slit plate 25 is defined with respect to ratio in magnitude of the image of the blue laser beam 8c to the image of the flare 52, so as to eliminate the flare 52 most effectively.

In FIG. 5, Z represents depth position on the optical axis 23a, and the focal point 53 is assumed to be a reference point (Z=0), a forward direction of the blue laser beam 8c is assumed to be positive (Z>0), and the position of the condenser lens 23, i.e. the principal point, is represented by Z=−L (L>0). Then diameters of the blue laser beam 8c at a depth position Z on the exit side of the condenser lens 23 (Z>−L), i.e. image diameters Ωp(Z) and Ωv(Z) of the blue laser beam 8c in the lateral and vertical directions, can be expressed by the following equations:

$$\Omega p(Z) = \beta \cdot 2 \cdot \omega p \cdot [1 + \{Z/((\pi \cdot \omega p^2)/\lambda)\}^2]^{0.5}$$

$$\Omega v(Z) = \beta \cdot 2 \cdot \omega v \cdot [1 + \{Z/((\pi \cdot \omega v^2)/\lambda)\}^2]^{0.5}$$

wherein λ represents a wavelength of the blue laser beam 8c, ωp and ωv represent radii of the blue laser beam 8c in the lateral and vertical directions at the emission surface respectively.

On the other hand, widths dp(Z) and dv(Z) of the flare 52 in the lateral and vertical directions at a depth position on the exit side of the condenser lens 23 (Z>−L) can be expressed by the following equations:

$$dp(Z) = (\beta \cdot dp/L) \cdot (Z+L)$$

$$dv(Z) = (\beta \cdot dv/L) \cdot (Z+L)$$

Provided that Pp(Z) and Pv(Z) represent the magnitude rates of the image of the blue laser beam 8c relative to the image of the flare 52 in the lateral and vertical directions, that is Pp(Z)=Ωp(Z)/dp(Z) and Pv(Z)=Ωv(Z)/dv(Z), the slit plate 25 is located at a depth position Z where the magnitude rates Pp(Z) and Pv(Z) are not more than predetermined values P1 and P2, which are limit values of the rates Pp(Z) and Pv(Z) at the infinity (Z→∞), and can be expressed by the following equations:

$$P1 = \lim_{Z \to \infty} \{Pp(Z)\}$$

$$P2 = \lim_{Z \to \infty} \{Pv(Z)\}$$

Figure 9:
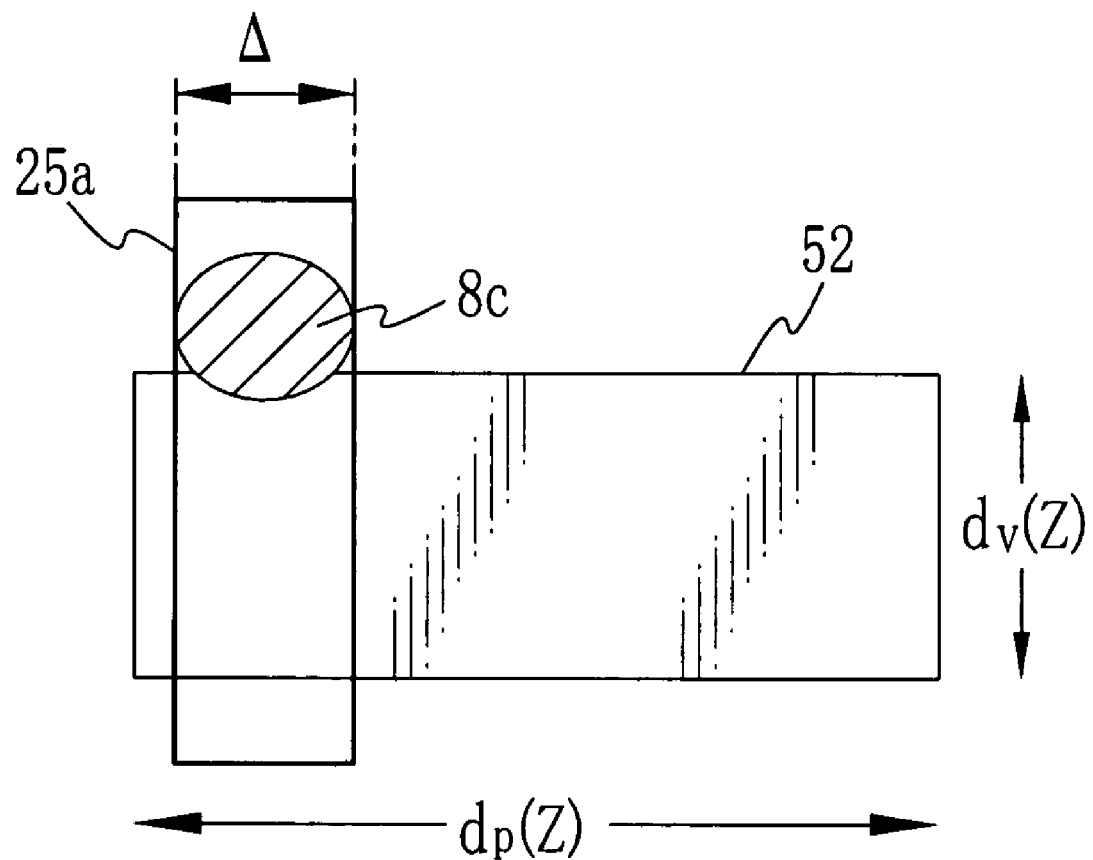
FIG. 9 is an explanatory diagram illustrating a slit of the slit plate in a vertical plane to the optical axis.

For example, where ωp=0.675 μm, ωv=0.337 μm, dp=0.37 mm, dv=0.175 mm, β=28.5, and L=125.4 mm, the rates Pp(Z) and Pv(Z) behave in relation to the depth position Z in the way as shown in FIG. 9, wherein the numerals on the abscissa represent values obtained by adding 100 to respective depth position values Z, for the sake of logarithmic expression.

On a positive side where Z<0, the rates Pp(Z) and Pv(Z) decrease with an increase in the value Z, and come to the minimum at the focal point 53 (Z=0). In a negative where Z>0, the rates Pp(Z) and Pv(Z) increase with an increase in the value Z, and converge to the predetermined value P1 and P2 at the infinity (Z→∞). Accordingly, the effective location of the slit plate 25 to eliminate the flare can be chosen in a wider range on the positive side than on the negative side.

According to the present embodiment, the AOM 24 is located at the focal point 53, and the slit plate 25 is located between the condenser lens 23 and the focal point 53 (−L<Z<0). Provided that the conditions Pp(Z)=P1 and Pv(Z)=P2 are satisfied at a depth position Z0 on the negative side:

$$P_p(Z0) = \lim_{Z \to \infty} \{Pp(Z)\}$$

$$P_v(Z0) = \lim_{Z \to \infty} \{Pv(Z)\}$$

Figure 8:
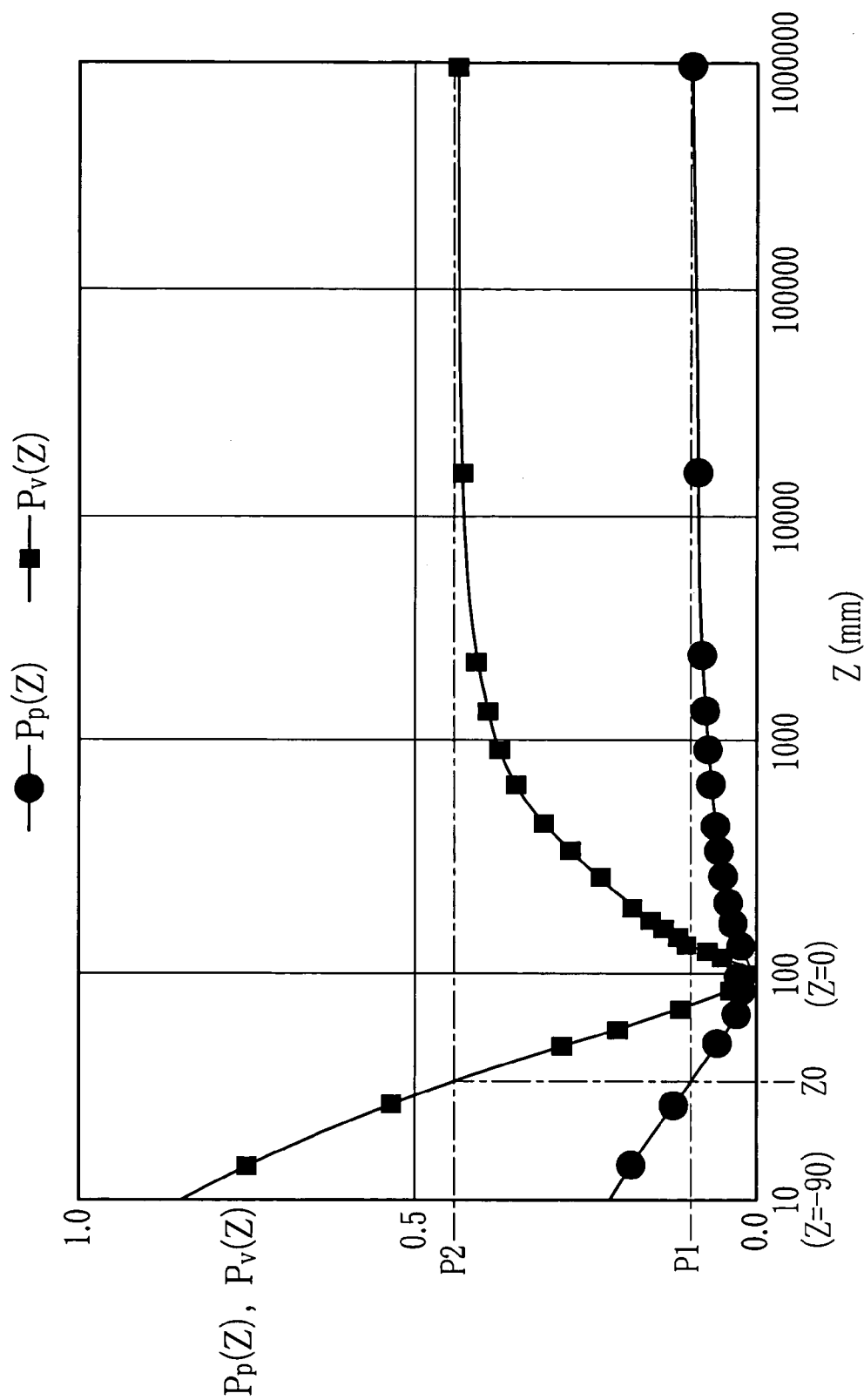
FIG. 8 is a graph illustrating magnitude rates of the image of the blue laser beam to the image of the flare in relation to the depth position on the optical axis.

Pp(Z)≦P1 and Pv(Z)≦P2 in a range Z0≦Z<0, and the rates Pp(Z) and Pv(Z) are lowered so much in this range Z0≦Z<0 as on the positive side of the depth position Z. Therefore, locating the slit plate 25 in the range Z0≦Z<0 will enhance the effect of eliminating the flare by the slit plate 25 up to a comparable degree to a case where the slit plate 25 is located on the positive side Z>0. It is to be noted that the depth position Z0 is about −65 mm in the example shown in FIG. 8.

As shown in FIG. 9, the slit 25a of the slit plate 25 has a rectangular shape in a vertical plane to the optical axis 23a, to limit the flare 52 in the lateral direction. Since the rate Pp(Z) is smaller than the rate Pv(Z) in the example of FIG. 8, most components of the flare 52 are eliminated by shielding the flare 52 by defining a length in the lateral direction or width Δ of the slit 25a of the slit plate 25 in accordance with the lateral diameter of the blue laser beam 8c.

Figure 10:
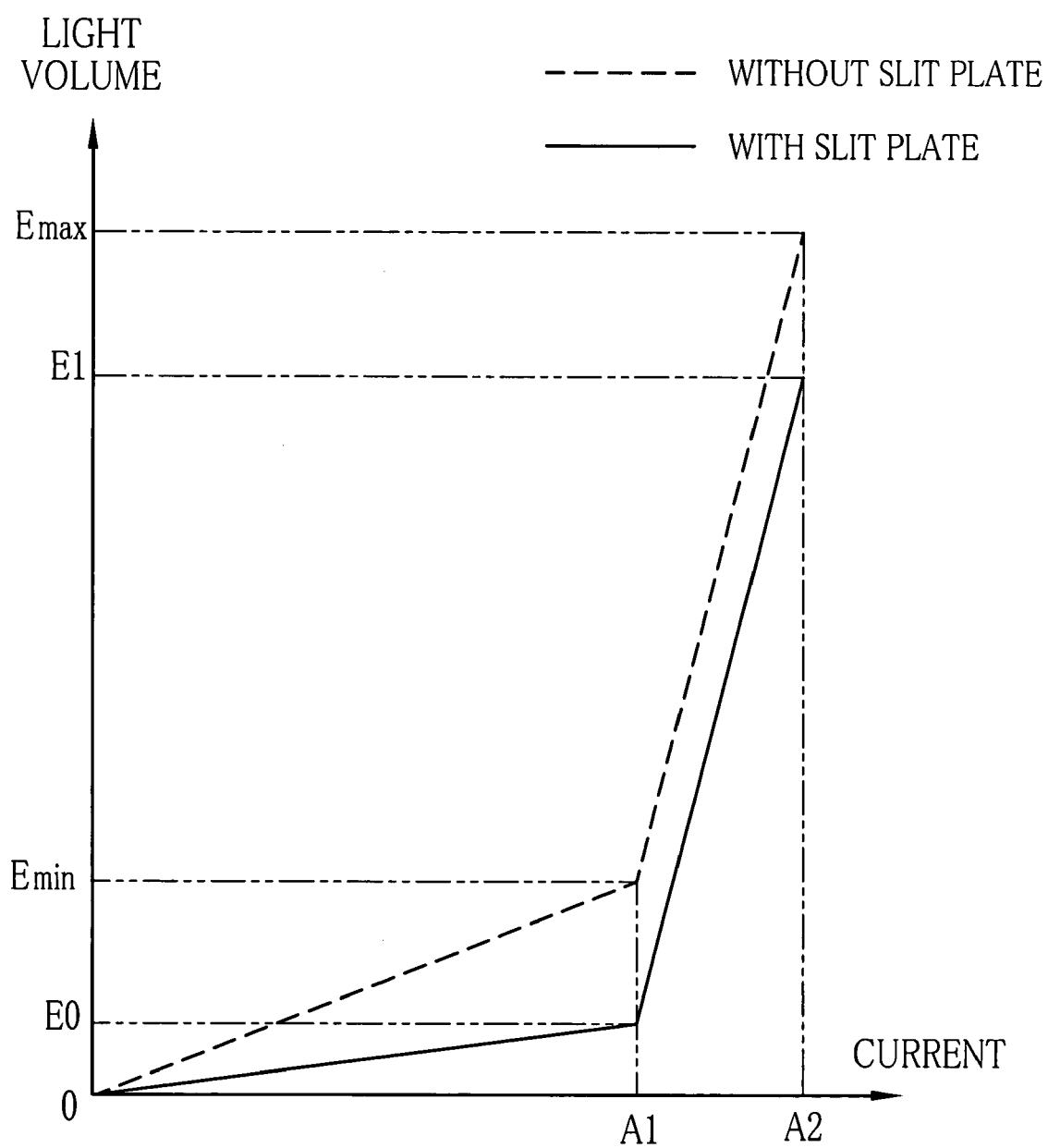
FIG. 10 shows curves of light volume from the blue laser light source in relation to injected current in a case using the slit plate and a case without the slit plate.

The width Δ of the slit 25a is optimized in the way as set forth below. FIG. 10 shows curves of the light volume from the blue laser light source 13 in relation to the injected current in a case using the slit plate 25 and a case without the slit plate 25. The blue laser light source 13 starts emitting the blue laser beam 8c when the injected current goes above a threshold value or lasing threshold A1. A2 represents a maximum value of the injected current. Emin and Emax respectively represent a minimum light volume of the laser at the threshold value A1 and a maximum light volume of the laser at the maximum current A2, both in the case without the slit plate 25. On the other hand, E0 and E1 respectively represent a minimum light volume of the laser at the threshold value A1 and a maximum light volume of the laser at the maximum current A2, both in the case using the slit plate 25.

The minimum light volume Emin is considered to be provided all from the flare 52 that is emitted from the sapphire substrate 52, and the minimum light volume E0 is reduced from the light volume Emim by such an amount as the slit plate 25 shields the flare 52. So the light volume E0 can be expressed as follows:

$$E0 = Emin \cdot \Delta / \{dp(Z) + dv(Z)\}$$

Furthermore, because the light volume E1 is reduced from the light volume Emax by a difference in light volume (Emin−E0) that is provided by shielding the flare 52 with the slit plate 25, the light volume E1 can be expressed as follows:

$$E1 = Emax - (Emin - E0)$$

$$= Emax - Emin \cdot [1 - \Delta/\{dp(z) + dv(z)\}]$$

In order to record images in the blue photosensitive layer 5c of the photosensitive material 5 with sufficient density contrast, a light volume rate R, or a dynamic range of exposure amount, of the blue laser beam 8c needs to satisfy a condition E1/E0≧R. Accordingly, the width Δ of the slit 25a is defined to satisfy the following condition:

$$\Delta \leq (Emax - Emin) / [Emin \cdot (R-1) \cdot \{dp(Z) + dv(Z)\}]$$

It is to be noted that the light volume rate R is a value obtained from a division of a maximum exposure amount by a minimum exposure amount, wherein the maximum exposure amount is a light amount output at a maximum value of the image data, and the minimum exposure amount is a light amount output at a minimum value of the image data. The blue photosensitive layer 5c is preferably a silver salt material sensitive to light of a wavelength range from 400 nm to 480 nm or so. The light volume rate R preferably satisfies a condition: log(R)≧1.5.

As described so far, the laser printer 2 is provided with the light source device that has the blue laser light source 13, the condenser lens 23 and the slit plate 25, which are so configured as to eliminate the flare 52 efficiently. According to the method of the present invention, beam quality of the blue laser beam 8c as projected onto the photosensitive material 5 is little affected by the flare 52 while reducing the loss of light volume of the blue laser beam 8c, which is caused by the flare elimination. As a result, differences between the three color laser beams 8a to 8c are also reduced on the photosensitive material 5, improving the quality of the recorded images.

In the above embodiment, the laser beams 8a to 8c from the respective laser light sources 11 to 13 are acoustooptically modulated through the AOMs 20, 22 and 24 as external modulators. However, the present invention is not to be limited to the above embodiment, but it is possible to modulate the laser light source 11 to 13 directly without using the AOMs 20, 22 and 24.

Although the scanning-exposure device 4 is provided with the three color laser light sources 11 to 13, the present invention is not only applicable to such scanning-exposure devices but also to any scanning-exposure devices insofar as they are provided with at least a semiconductor laser whose substrate is transparent to its emission wavelength, such as a sapphire substrate or a SiC substrate.

Thus the present invention is not to be limited to the above embodiments but, on the contrary, various modifications will be possible without departing from the scope of the invention as specified in claims appended hereto.

What is claimed is:

1. A light source device for scanning-exposure comprising: a semiconductor laser having a substrate that is transparent to a wavelength of a laser beam emitted from an active layer; a condenser lens for converging said laser beam at least in a direction parallel to an active surface of said active layer; and a light flux limiting device for limiting light flux on an exit side of said condenser lens so as to eliminate extraneous light flux that is radiated from said substrate, wherein said light flux limiting device is located at a depth position Z on an optical axis of said condenser lens, said depth position Z satisfying conditions defined as follows:

$Z \geq Z0$, $Z0 < 0$ and $$Pp(Z0) = \lim_{Z \to \infty} \{Pp(Z)\}$$

wherein Z is assumed to have a positive value on a forward side of said laser beam from a focal point of said laser beam through said condenser lens, Pp(Z) is a value obtained by dividing a width of said laser beam in said parallel direction to said active surface at said depth position Z by a width of said extraneous light in said parallel direction at said depth position Z.

2. A light source device as claimed in claim 1, wherein said light flux limiting device has an opening whose width $\Delta$ in said parallel direction to said active surface is defined by a relational expression as follows:

$$\Delta \leq (E\text{max}-E\text{min})/[E\text{min} \cdot (R-1) \cdot \{dp(Z)+dv(Z)\}]$$

wherein Emax is a maximum light volume of said semiconductor laser, Emin represents a light volume at a lasing threshold, R is a light volume rate representative of a ratio between a maximum exposure amount and a minimum exposure amount necessary for gaining sufficient density contrast, dp(Z) represents a width of said extraneous light in said parallel direction at said depth position Z, and dv(Z) represents a width of said extraneous light in a vertical direction to said active surface at said depth position Z.

3. A scanning-exposure apparatus for scanning a photosensitive material with at least a laser beam to record an image on said photosensitive material, said scanning-exposure apparatus comprising:

a light source device for emitting said laser beam, said a light source device comprising a semiconductor laser whose substrate is transparent to a wavelength of said laser beam, a condenser lens for converging said laser beam at least in a direction parallel to an active surface of said active layer, and a light flux limiting device for limiting light flux on an exit side of said condenser lens so as to eliminate extraneous light that is radiated from said substrate, wherein said light flux limiting device is located at a depth position Z on an optical axis of said condenser lens, said depth position Z satisfying conditions defined as follows:

$Z \geq Z0$, $Z0 < 0$ and $$Pp(Z0) = \lim_{Z \to \infty} \{Pp(Z)\}$$

wherein Z is assumed to have a positive value on a forward side of said laser beam from a focal point of said laser beam through said condenser lens, Pp(Z) is a value obtained by dividing a width of said laser beam in said parallel direction to said active surface at said depth position Z by a width of said extraneous light in said parallel direction at said depth position;

a deflector placed on an exit side of said light source device, for deflecting said laser beam; and a lens system for projecting said deflected laser beam onto said photosensitive material.

4. A scanning-exposure apparatus as claimed in claim 3, wherein said light flux limiting device has an opening whose width $\Delta$ in said parallel direction to said active surface is defined by a relational expression as follows:

$$\Delta \leq (E\text{max}-E\text{min})/[E\text{min} \cdot (R-1) \cdot \{dp(Z)+dv(Z)\}]$$

wherein Emax represents a maximum light volume of said semiconductor laser, Emin represents a minimum light volume at a lasing threshold, R is a light volume rate representative of a ratio between a maximum exposure amount and a minimum exposure amount necessary for gaining sufficient density contrast, dp(Z) represents a width of said extraneous light in said parallel direction at said depth position Z, and dv(Z) represents a width of said extraneous light in a vertical direction to said active surface at said depth position Z.

5. A scanning-exposure apparatus as claimed in claim 4, wherein said photosensitive material is a silver salt photosensitive material, and a logarithmic value log(R) of said light volume rate R satisfies a condition: $\log(R) \geq 1.5$.

6. A scanning-exposure method for scanning a photosensitive material with at least a laser beam emitted from a light source device using a semiconductor laser whose substrate is transparent to a wavelength of a laser beam emitted from an active layer, a condenser lens for converging said laser beam at least in a direction parallel to an active surface of said active layer, and a light flux limiting device for limiting light flux on an exit side of said condenser lens so as to eliminate extraneous light that is radiated from said substrate, comprising steps of:

locating said light flux limiting device at a depth position Z on an optical axis of said condenser lens, said depth position Z satisfying conditions defined as follows:

$Z \geq Z0$, $Z0 < 0$ and $$Pp(Z0) = \lim_{Z \to \infty} \{Pp(Z)\}$$

wherein Z is assumed to have a positive value on a forward side of said laser beam from a focal point of said laser beam through said condenser lens, Pp(Z) is a value obtained by dividing a width of said laser beam in said parallel direction to said active surface at said depth position Z by a width of said extraneous light in said parallel direction at said depth position; and forming an opening of said light flux limiting device to have a width $\Delta$ in said parallel direction to said active surface, that is defined by a relational expression as follows:

$$\Delta \leq (E\text{max}-E\text{min})/[E\text{min} \cdot (R-1) \cdot \{dp(Z)+dv(Z)\}]$$

wherein Emax represents a maximum light volume of said semiconductor laser, Emin represents a minimum light volume at a lasing threshold, R is a light volume rate representative of a ratio between a maximum exposure amount and a minimum exposure amount necessary for gaining sufficient density contrast, dp(Z) represents a width of said extraneous light in said parallel direction at said depth position Z, and dv(Z) represents a width of said extraneous light in a vertical direction to said active surface at said depth position Z.

7. A scanning-exposure method as claimed in claim 6, wherein said photosensitive material is a silver salt photosensitive material, and a logarithmic value log (R) of said light volume rate R is defined to satisfy a condition: $\log(R) \geq 1.5$.

* * * * *